United States Patent [19]
Sit et al.

[11] Patent Number: 5,963,843
[45] Date of Patent: *Oct. 5, 1999

[54] AMPLIFIER SWITCH CONTROLLER AND SYSTEM

[75] Inventors: Eric K. Sit, Eden Prairie; John C. Keller, Minneapolis; Jeffrey O. Brown, St. Paul; Reuben W. Meline, Crystal; Leah E. Danzinger, Minneapolis; Zakhary Bluband, Phymouth; Todd C. Ortberg, Chanhassen, all of Minn.

[73] Assignee: ADC Telecommunications, Inc., Minnetonka, Minn.

[*] Notice: This patent issued on a continued prosecution application filed under 37 CFR 1.53(d), and is subject to the twenty year patent term provisions of 35 U.S.C. 154(a)(2).

[21] Appl. No.: 08/762,519

[22] Filed: Dec. 9, 1996

[51] Int. Cl.⁶ .................................................. H04N 7/173
[52] U.S. Cl. .................................. 455/3.3; 348/6; 455/3.1
[58] Field of Search ........................... 348/6; 455/8, 3.1, 455/4.1, 6.1; 330/124 R, 124 D, 1 R, 2; H04N 7/10

[56] References Cited

U.S. PATENT DOCUMENTS

| | | | |
|---|---|---|---|
| 3,519,945 | 7/1970 | Lawson et al. | 330/2 |
| 4,236,250 | 11/1980 | Huffman | 455/49 |
| 5,243,647 | 9/1993 | Parikh et al. | 380/4 |
| 5,418,490 | 5/1995 | Kaegebein . | |
| 5,495,283 | 2/1996 | Cowe . | |
| 5,550,825 | 8/1996 | McMullan, Jr. et al. . | |
| 5,559,549 | 9/1996 | Hendricks et al. . | |

FOREIGN PATENT DOCUMENTS

| | | |
|---|---|---|
| 26 05 499 | 8/1977 | Germany . |
| WO 91/19348 | 12/1991 | WIPO . |

OTHER PUBLICATIONS

English translation of German patent application DE 3939–135, Apr. 1991.
English translation of Japanese patent application HEI 5[1993]–219507, Aug. 1993.

Primary Examiner—Nathan Flynn
Attorney, Agent, or Firm—Merchant & Gould P.C.

[57] ABSTRACT

An amplifier switch controller is provided for use in a headend cable transmission system having first and second amplifiers and amplifier input and output paths connected to one of the first and second amplifiers, which becomes the currently activated amplifier. The amplifier switch controller comprises an input sampler for sampling a combined signal on the input signal path and measuring an input signal level. The amplifier switch controller also comprises an output sampler for sampling the amplified combined signal on the output signal path and measuring an output signal level. A program means receives the input and output signal levels and determines whether the currently activated amplifier is not functioning properly. If it is not functioning properly, the program means generates a control signal to a switch. In response to the control signals, the switch disconnects the input and output signal paths from the currently activated amplifier and connects each of the input and output signal paths to the other one of the first and second amplifiers.

44 Claims, 7 Drawing Sheets

AMPLIFIER SWITCH CONTROLLER AND SYSTEM

FIELD OF THE INVENTION

The present invention relates to the transmission of broad band signals in audio, video and data transmission systems. More particularly, the present invention relates to monitoring and switching circuits for components in audio, video and data transmission systems.

BACKGROUND OF THE INVENTION

In recent years the cable television industry has grown tremendously, with the likelihood of continuing to grow in future years. Future growth could enable the cable television industry to provide hundreds, possibly thousands of cable television channels to consumers. As the cable television industry consumer base has grown, it has become increasingly important to minimize breakdowns in cable television systems in order to avoid loss of service to customers.

Typically, a cable television system includes a location for receiving and distributing program signals, which are broad band radio-frequency (RF) signals (i.e., 5 MHz to 1000 MHz). This location is commonly known as a headend where incoming program signals are received from sources such as a satellite dish, an antenna, a VCR tape, and the like. For most incoming broad band signal channels, the headend has individual modulators for modulating each of the signals to the appropriate frequency band for its particular channel. The modulators each provide output signals that are fed into a combiner network. The combiner network combines all of the signals received from the various channels on one wide band of frequencies. Because signals lose approximately 3 dB for every two signals combined, the combined signal output must be amplified to compensate for the loss. A high-powered amplifier amplifies the combined signal to produce an amplified combined signal which is then transmitted to a splitter network. The splitter network divides the amplified combined signal into numerous signals for distribution to multiple locations.

Amplifiers in the headend are prone to breakdowns and operational failures because such amplifiers must run at high power levels to reduce signal distortion. The high power levels produce heat that can cause degradation of the semiconductors and, ultimately, amplifier operational failure. Because the headend may be operated electronically from a remote location, it is often unattended by a human operator. Currently, the failure of one amplifier in a headend may affect more than 100,000 customers. Service to the affected customers is delayed until a human operator is dispatched to correct the problem. Such delays are expensive to the cable television industry and result in customer frustration and dissatisfaction.

The present invention provides a solution to these and other problems and offers advantages over the prior art.

SUMMARY OF THE INVENTION

The present invention relates to monitoring and switching circuits for components in a headend of a cable transmission system. In particular, the present invention relates to an amplifier switch controller having an input sampler for sampling an input signal carried on an amplifier input signal path operatively connected to either a first amplifier or a second amplifier and an output sampler for sampling an output signal carried on an amplifier output signal path operatively connected to the same one of the first and second amplifiers. The amplifier to which the amplifier input and output signal paths are connected is the currently activated amplifier. The amplifier switch controller has program means for receiving the sampled input and output signals and for calculating whether the currently activated amplifier is functioning properly. If the currently activated amplifier is not functioning properly, the program means generates control signals that are transmitted to a switching component for disconnecting the input and output signal paths from the currently activated amplifier and for connecting the input and output signal paths to the other one of the first and second amplifiers.

According to one aspect of the present invention, the program means includes calculations determining a desired range of amplifier gain of the currently activated amplifier and comparing an actual gain of the currently activated amplifier to the desired range of amplifier gain. The desired range of amplifier gain may be calculated by measuring an amplifier calibration gain of the currently activated amplifier and combining it with a threshold or variable tolerance gain value. The threshold gain may be generated as a default value by the program means. Alternatively, the threshold gain may be manually selected by a user.

In accordance with another embodiment of the invention, a headend cable transmission system is disclosed, having a plurality of receivers, a signal combiner operatively connected to the receivers for receiving input program signals and for generating a combined signal, an amplifier input signal path operatively connected to the signal combiner for transmitting the combined signal, a first amplifier and a second amplifier with one of the first and second amplifiers being operatively connected to the amplifier input signal path for receiving and amplifying the combined signal, an amplifier output signal path operatively connected to the same one of the first and second amplifiers for transmitting the amplified combined signal, a splitter operatively connected to the amplifier output signal path for receiving the amplified combined signal, and an amplifier switch controller operatively connected to the amplifier input and output signal paths. The amplifier to which the input and output signal paths are connected is the currently activated amplifier. The amplifier switch controller has an input sampler for sampling the combined signal carried on the amplifier input signal path and an output sampler for sampling an amplified combined signal carried on an amplifier output signal path. The amplifier switch controller has program means for receiving the sampled input and output signals and calculating whether the currently activated amplifier is functioning properly. If the currently activated amplifier is not functioning properly, the program means generates control signals that are transmitted to a switching component for disconnecting the input and output signal paths from the currently activated amplifier and for connecting the input and output signal paths to the other one of the first and second amplifiers.

These and various other features as well as advantages that characterize the present invention will be apparent upon reading of the following detailed description and review of the associated drawings.

DETAILED DESCRIPTION OF THE INVENTION

Figure 1:
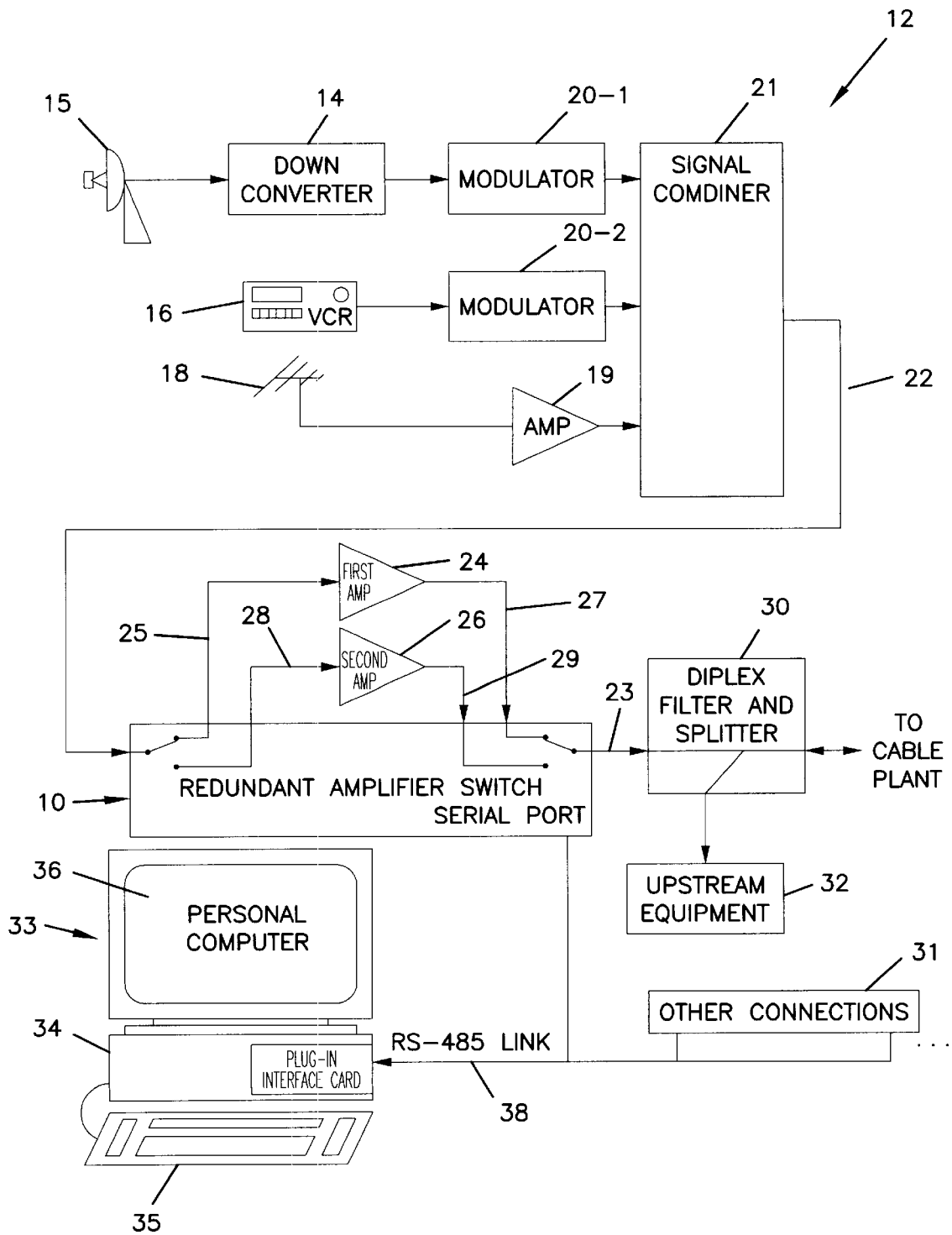
FIG. 1 is a schematic view of a headend of a cable television system with an amplifier switch controller operatively connected to the system according to the present invention.

With reference to the drawings in which like elements are numbered identically throughout, a detailed description of the invention is provided. This description does not limit the scope of the invention, which is limited only by the scope of the attached claims.

In general terms, the present invention relates to an amplifier switch controller 10 for use in a headend 12 of a cable television system. Generally, the amplifier switch controller 10 comprises an input sampler 40, an output sampler 42, a microcontroller 110 with a software program 150 for determining whether a currently activated amplifier is functioning properly, and a switching component 46 for switching control from the currently activated amplifier to an inactivated amplifier when the microcontroller 110 generates a control signal indicating that the currently activated amplifier is not functioning properly.

FIG. 1 shows a schematic representation of the amplifier switch controller 10 in a headend 12 of a cable television system. As shown in FIG. 1, the headend 12 includes receivers for receiving broad band video and audio RF signals. A variety of receivers may be used, such as, for example, a down converter 14 for receiving program signals from a satellite dish 15, a VCR 16 for receiving program signals from a tape, or an antenna 18 for receiving program signals through airwaves. It will be apparent to those in the art that the type of receiver will depend upon the medium from which the program signal is received or otherwise accessed. Generally, each signal is transmitted over its own program channel. Modulators, such as modulators 20-1 and 20-2, typically correspond to each program channel for receiving the channel program signals and modulating and converting the program signals to a selected output frequency band for combining with other modulated carriers. However, signals received directly from an antenna, such as the antenna 18, are usually processed by an amplifier 19. The modulators, such as modulators 20-1 and 20-2, and any amplifiers, such as amplifier 19, transmit the modulated and amplified program signals to a signal combiner 21.

Because the program signals from the various channels have different frequencies, the signal combiner 21 combines all of the program signals to be multiplexed on one wide band of frequencies and generates one combined signal. The combined signal is typically transmitted on one signal path, referred to herein as amplifier input signal path 22. The amplifier input signal path 22 is operatively connected to either an amplifier input 25 of a first amplifier 24 or an amplifier input 28 of a second amplifier 26. The amplifier to which the amplifier input signal path 22 is connected is the currently activated amplifier and generates an amplified combined signal after receiving the combined signal. An amplifier output signal path 23 is operatively connected to the amplifier output 27 or 29 of the currently activated amplifier 24 or 26, for receiving the amplified combined signal. The amplifier switch controller 10 is connected to both the amplifier input signal path 22 and the amplifier output signal path 23.

The amplifier output signal path 23 is typically connected to a diplex filter and a splitter, both indicated generally by reference numeral 30. The splitter generates multiple signals containing the entire spectrum of program channel signals from the amplified combined signal and transmits the multiple signals to many different areas, which are ultimately received by many different consumers. The diplex filter may also be connected to upstream equipment 32, which represents signals being transmitted from individual consumers back to the headend 12 to accomplish two-way communication between consumers and cable television systems. The receivers 14, 16 and 18, the modulators 20-1 and 20-2, the signal combiner 21, the first and second amplifiers 24 and 26, the diplex filter and splitter 30 are all commercially available products currently being used in headend facilities.

Finally, the amplifier switch controller 10 is connected to a monitoring device 33, such as, for example, a personal computer 34 with a display unit such as a CRT 36 and a user interface 35, such as, for example, a keyboard, a mouse, a touch-screen CRT and the like. This connection is accomplished through an RS-485 communication link 38 which is well known in the art. It will be apparent that the RS-485 serial communication link 38 can be connected to a plurality of other systems or monitoring devices indicated by reference numeral 31.

Figure 2:
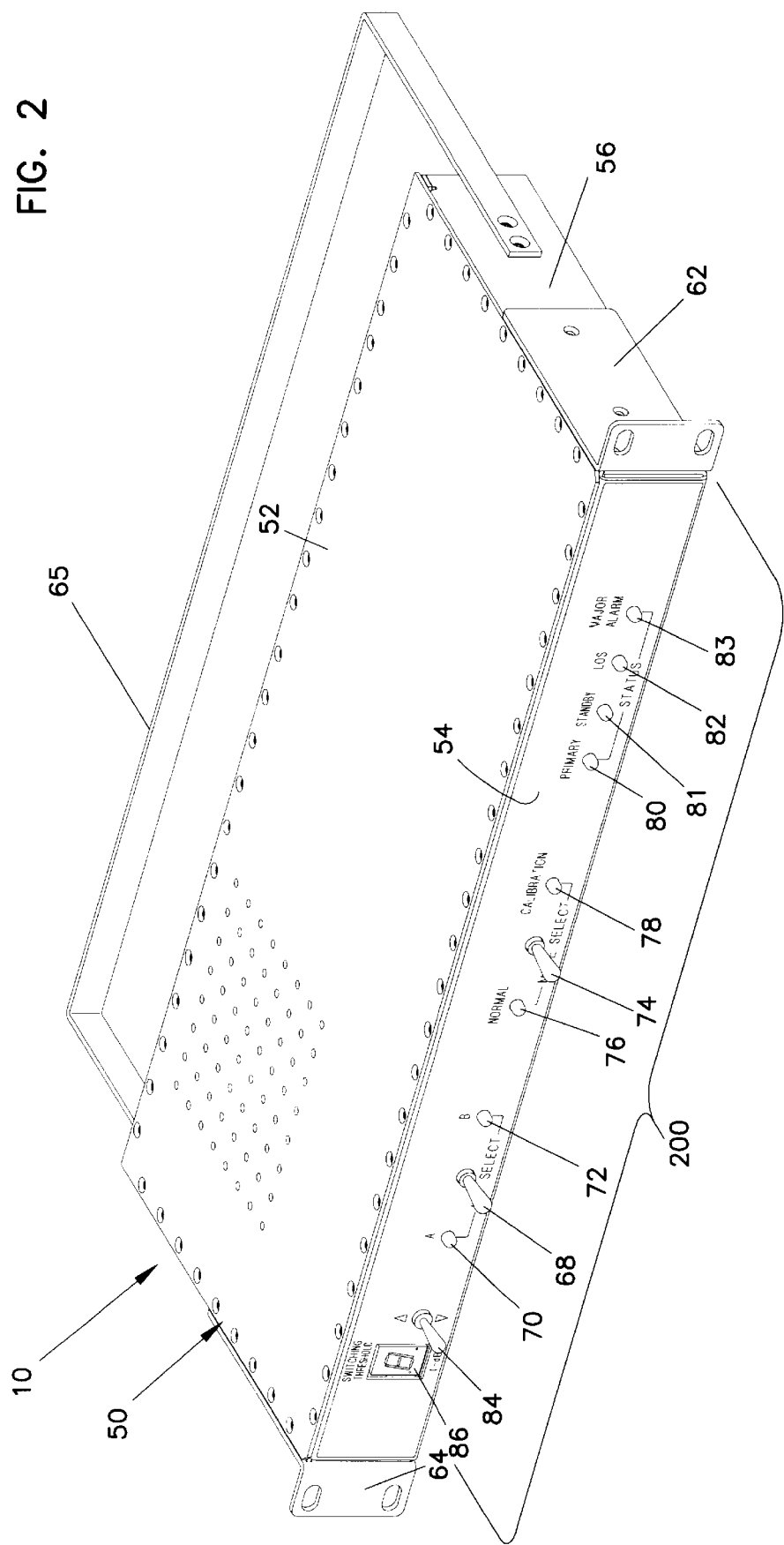
FIG. 2 is a front, top and left side perspective view of the amplifier switch controller of FIG. 1.
Figure 3:
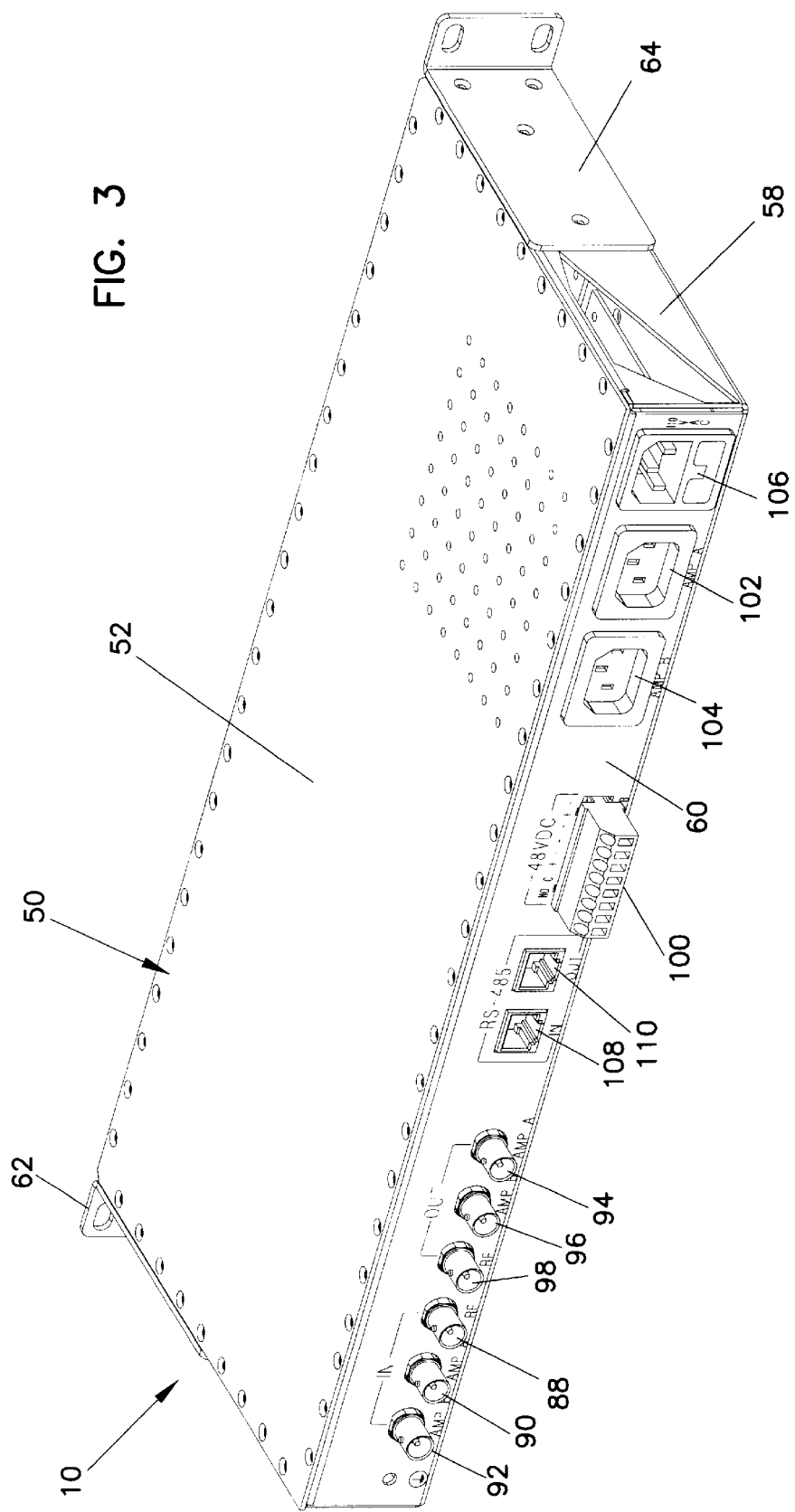
FIG. 3 is a rear, top and right side perspective view of the amplifier switch controller of FIG. 1.
Figure 4:
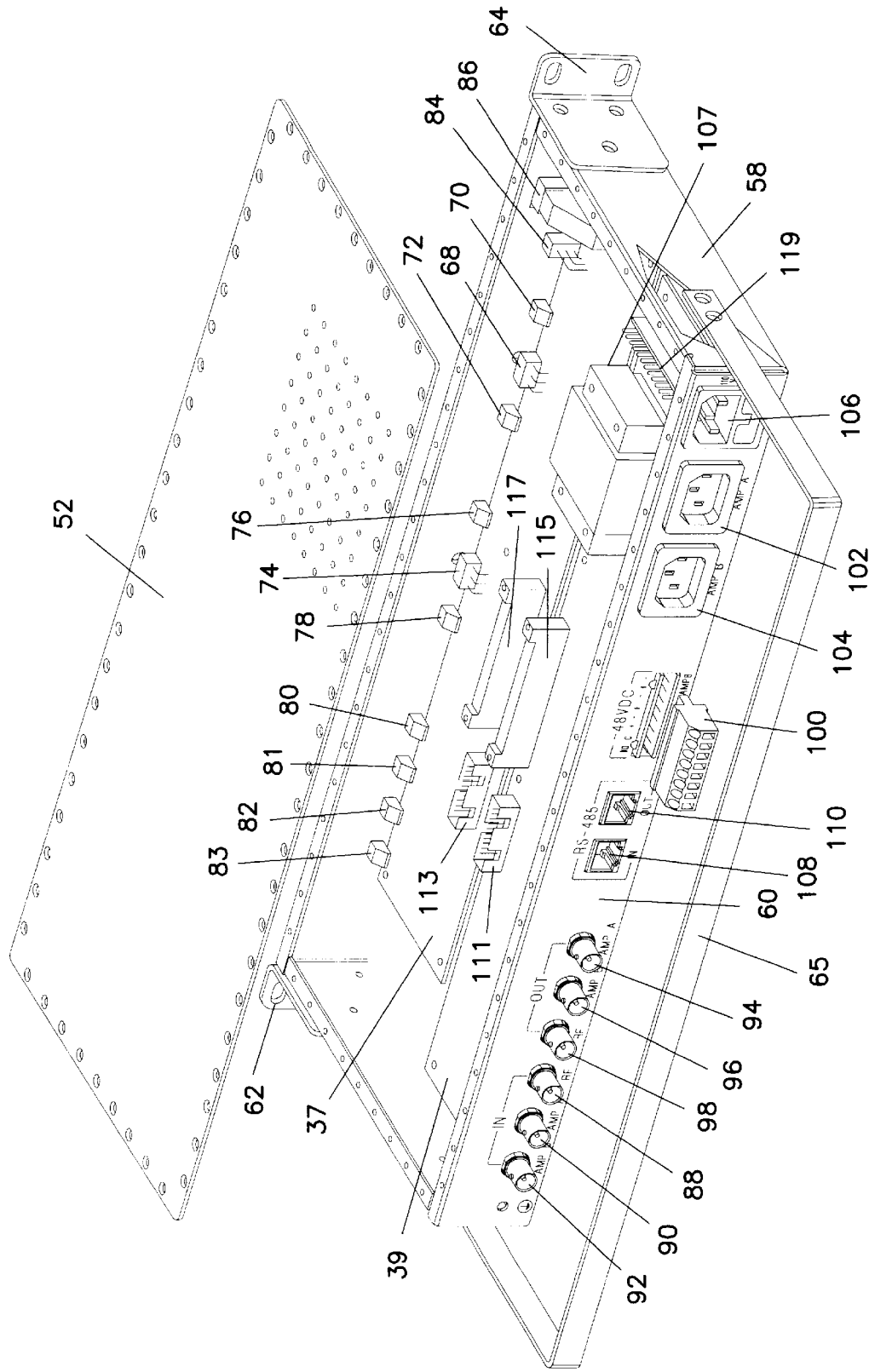
FIG. 4 is a rear, top, and right side exploded view of the amplifier switch controller of FIG. 1 with a top panel removed from a frame of the amplifier switch controller.

FIGS. 2, 3 and 4 show an external housing frame 50 of the amplifier switch controller 10 according to the present invention. The frame 50 includes an upper panel 52, a front panel 54, a left side panel 56, a right side panel 58, a rear panel 60 and a bottom panel (not shown) that is substantially parallel to and vertically spaced from the upper panel 52. Left and right brackets 62 and 64 are mounted on the left and right side panels 56 and 58, respectively, adjacent to the front panel 54. The brackets 62 and 64 are used for mounting the frame 50 into a rack at a headend. A cable bar 65 may be mounted to the frame 50 for easing strain on cables attached to the frame 50.

The front panel 54 of the frame 50 provides various manual switches and displays 200 (i.e., 68, 70, 72, 74, 76, 78, 80–83, 84, and 86) for the amplifier switch controller 10. An amplifier selection switch 68 is provided and can be toggled between a first amplifier activation setting and a second amplifier activation setting. Two LED displays 70 and 72 correspond to the first amplifier 24 and the second amplifier 26, respectively, for indicating which of the two amplifiers 24 and 26 has been manually selected by a user through the amplification selection switch 68 to be the currently activated amplifier. A mode selection switch 74 is provided and can be toggled between a normal mode indicated by LED display 76 or a calibration mode indicated by LED display 78. Other LED displays 80, 81, 82 and 83 are provided on the front panel 54 to indicate that the first amplifier 24 is currently activated, that the second amplifier 26 is currently activated, that there has been a loss of signal, or that there has been a system failure, respectively.

Finally, a threshold setting switch 84 is provided on the front panel 54. The threshold setting switch 84 can be toggled upwardly or downwardly to increase or decrease, respectively, a threshold or variable tolerance value. A display area 86 is provided on the display panel 54 next to the threshold setting switch 84 in order to display the variable tolerance value set by a user toggling the threshold setting switch 84. Alternatively, the threshold setting switch 84 could be used to set values for different numbers, such as, for example, an actual lower gain limit of the currently activated amplifier rather than the variable tolerance to be used to calculate the lower gain limit. It will also be apparent to those in the art that various other component tolerances could be selected by a user through the use of a separate, designated switch or through the use of a single switch with additional control switching capacity for controlling which component threshold is currently being selected.

FIG. 3 shows the back panel 60 of the frame 50. The back panel 60 includes connectors for the amplifier input and output signal paths 22 and 23 and the first and second amplifiers 24 and 26. RF input connector 88 is connected to the amplifier input signal path 22. Connectors 90 and 92 are connected to the first amplifier input 25 and the second amplifier input 28, respectively. Connectors 94 and 96 are connected to the first amplifier output 27 and the second amplifier output 29, respectively. RF output connector 98 is connected to the amplifier output signal path 23.

Figure 6:
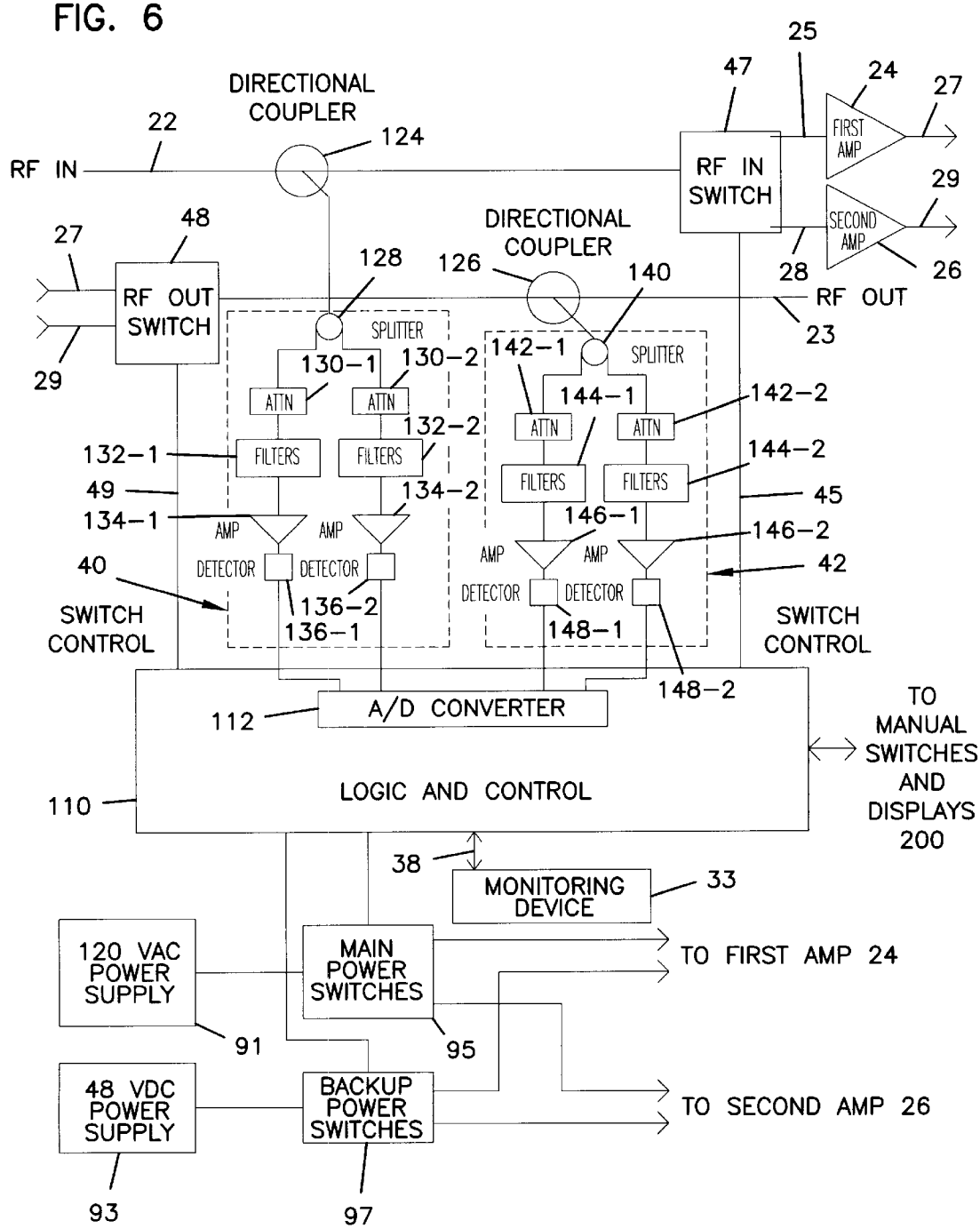
FIG. 6 is a schematic representation of the amplifier switch controller of FIG. 1, including component detail of input and output samplers of the amplifier switch controller.

The rear panel 60 of the frame 50 also includes power and communications connections. Terminal block 100 receives a negative 48 VDC power supply connection. Power connector 106 receives alternating current (AC) power in a normal household range of 100V to 140V, for powering modular components in the amplifier switch controller 10. Power connectors 102 and 104 are configured for connection to the first and second amplifiers 24 and 26, respectively, for providing the normal AC power from the amplifier switch controller 10 to the first and second amplifiers 24 and 26, respectively. Finally, RS-485 in and out communication connectors 108 and 110 are provided on the rear panel 60, which can be connected to the monitoring device 33 or other similar devices capable of communicating across an RS-485 serial communication bus. As shown in FIG. 6, the communication link 38, the monitoring device 33 and the amplifier switch controller 10 can be configured to allow two-way communications, such that a user can input desired data through the monitoring device 33, such as, for example, tolerances of each of the components in the amplifier switch controller 10.

Figure 5:
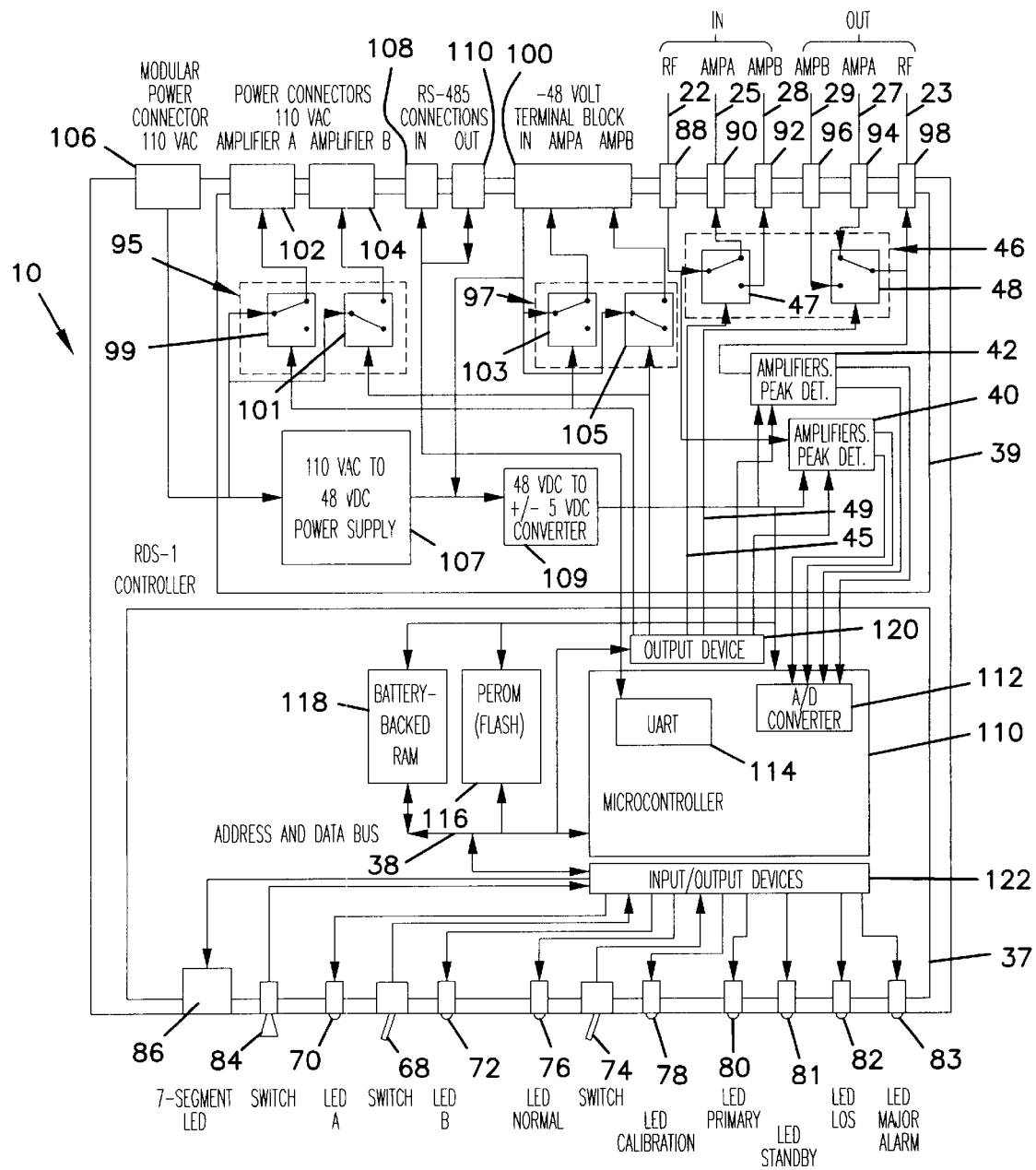
FIG. 5 is a circuit block diagram of the amplifier switch controller of FIG. 1.

With reference to FIG. 5, a circuit block diagram of the amplifier switch controller 10 is shown. A switching component 46 is shown having an input switch 47 and an output switch 48. The amplifier input signal path 22 is connected to the input switch 47 through an RF input connector 88. In one embodiment, after a combined signal passes through the RF input connector 88, a portion of the combined signal is drawn off and transmitted to an input sampler 40 by means of a 20 dB directional coupler 124 (shown in FIG. 6). The input switch 47 connects the amplifier input signal path 22 to either the first amplifier input 25 through the first amplifier input connector 90 if the first amplifier 24 is currently activated or to the second amplifier input 28 through the second amplifier input connector 92 if the second amplifier 26 is currently activated. The output switch 48 is connected to either the first amplifier output 27 through the first amplifier output connector 94 if the first amplifier 24 is currently activated or to the second amplifier output 29 through the second amplifier output connector 96 if the second amplifier 26 is currently activated. The switch 48 is also connected to the amplifier output signal path 23 through an RF output connector 98. Before the amplified combined signal passes through the RF output connector 98, a portion of the amplified combined signal is drawn off and transmitted to an output sampler 42 by means of a 20 dB directional coupler 126 (shown in FIG. 6). Directional couplers are commercially available, such as directional coupler 4-27923-5350 made by TRAK Microwave, 4726 Eisenhower Blvd., Tampa, Fla. 33634-6391. It will be apparent to those in the art that other means, such as, for example, resistive dividers, rather than directional couplers, could be used to direct the flow of a portion of the signals.

The input and output samplers 40 and 42 are each connected to an analog-to-digital (A/D) converter 112 of a microcontroller 110. In one embodiment, shown in FIGS. 5 and 6, these connections are preferably accomplished through two signal flow paths from each of the samplers 40 and 42 to the A/D converter 112. In one preferred embodiment, an 80C550 microcontroller, made by Philips Semiconductors, 811 East Arques Ave., Sunnyvale, Calif. 94088-3409, is used. This microcontroller has a built-in eight-channel A/D converter and a universal asynchronous receiver-transmitter (UART) 114. In one embodiment, the serial communication bus 38 is driven by a quad-RS485 driver/receiver (DS36954) made by National Semiconductor Corp., 2900 Semiconductor Drive, P.O. Box 58090, Santa Clara, Calif. 95052-8090. The microcontroller 110 is operatively connected to programmable read only memory (ROM) 116 and battery-backed RAM 118, which are commercially available.

The microcontroller 110 is operatively connected to the switching component 46 through an output device 120 for providing relay control signals to each of the switches 47 and 48 across control signal paths 45 and 49, respectively. The switches used in one preferred embodiment are Relay PC HF 2C Latching, number RK1E-L2-5V-H31 made by Aromat Corp., 921 Lively Blvd., Suite No. 1, Elk Grove Village, Ill. 60007. The microcontroller 110 is also operatively connected to output manual switches and displays 200. The microcontroller 110 provides signals to the displays 70, 72, 76, 78, 80–83, and 86, and receives signals from the switches 68, 74 and 84, through input/output devices 122. In one embodiment, the displays 70, 72, 76, 78, 80–83 and 86 are driven by octal registers MM74HC273 and octal tri-state buffers MM74HC244, the manual switches 68, 74 and 84 are driven by 20-key encoders MM74C923, and the signal switches 47 and 48 and the power switches 99, 101, 103 and 105 are driven by octal registers MM74HC273. The components MM74HC273, MM74HC244 and MM74C923 are all commercially available from sources such as National Semiconductor Corp., 2900 Semiconductor Drive, P.O. Box 58090, Santa Clara, Calif. 95052-8090. The switch inputs are controlled through software polling.

In one preferred embodiment, the microcontroller 110 is monitored by an external watchdog timer and voltage monitor (not shown). The watchdog timer resets the microcontroller 100 if it malfunctions.

The amplifier switch controller 10 accommodates a normal power supply 91 and a backup power supply 93, as shown in FIG. 6. The power connector 106 receives normal AC power of 100–140 volts from the normal power supply 91 and supplies the power to a main power switching component 95 having first and second main power switches 99 and 101. Each of the main power switches 99 and 101 has a power on position and a power off position. In FIG. 5 the first main power switch 99 is shown in the power on position and the second main power switch 101 is shown in the power off position. The first main power switch 99 supplies power to the first amplifier 24 when in the power on position and does not supply power to the first amplifier 24 when in the power off position. The second main power switch 101 supplies power to the second amplifier 26 when in the power on position and does not supply power to the second amplifier 26 when in the power off position.

A backup power switching component 97, having first and second backup power switches 103 and 105, receives power from the backup power supply 93 through terminal block 100. Each of the backup power switches 103 and 105 has a power on position and a power off position. In FIG. 5 the first backup power switch 103 is shown in the power on position and the second backup power switch 105 is shown in the power off position. The first backup power switch 103 supplies power to the first amplifier 24 when in the power on position and does not supply power to the first amplifier 24 when in the power off position. The second backup power switch 105 supplies power to the second amplifier 26 when in the power on position and does not supply power to the second amplifier 26 when in the power off position.

Power connector 106 is also connected to a transformer 107 for converting a normal AC power of 100–140 volts to a 48 VDC power. The transformer 107 and the terminal block 100 are connected to a 48 VDC converter 109. From the 48 VDC converter 109, the modular components of the amplifier switch controller 10 are powered. If power from the normal power supply 91 fails, then the 48 VDC power received from the backup power supply 93 provides a backup power supply for the modular components.

FIG. 6 shows a block diagram of the amplifier switch controller 10 with the input sampler 40 and the output sampler 42 shown with specific components. The input sampler 40 has a one-by-two splitter 128. Two signal flow paths connect the splitter 128 to attenuators 130-1 and 130-2. The attenuators 130-1 and 130-2 are connected to filters 132-1 and 132-2, respectively. Preferably, the filters 132-1 and 132-2 can be replaced by a customer if desired. Filters 132-1 and 132-2 are connected to amplifiers 134-1 and 134-2, respectively. The amplifiers 134-1 and 134-2 are connected to quasi-peak detectors 136-1 and 136-2, respectively. The detectors 136-1 and 136-2 transmit the detected amplitude of each signal to the A/D converter 112 in the microcontroller 110 in order to convert the analog signals into digital numbers. The output sampler 42 comprises the same components, including a one-by-two splitter 140, attenuators 142-1 and 142-2, filters 144-1 and 144-2, amplifiers 146-1 and 146-2, and quasi-peak detectors 148-1 and 148-2. Splitters, attenuators, filters, amplifiers and quasi-peak detectors are all commercially available products. Although many different makes of the named components could be used with adequate operational results, one preferred type of splitter for the present invention is product number 4-27924-0430, available from TRAK Microwave, 4726 Eisenhower Blvd., Tampa, Fla. 33634-6391. Attenuators of the type that can be used in the amplifier switch controller 10 are commercially available from sources such as Quality RF Services, Inc., 850 Parkway Street, Jupiter, Fla. 33477. One preferred type of quasi-peak detector is a commercially available schottky diode.

FIG. 4 shows a rear, top and right side perspective view of the amplifier switch controller 10 with the top panel 52 removed, exposing the interior hardware configuration. In the embodiments shown in FIGS. 4 and 5, the microcontroller 110 and the manual switches and displays 200 are all integrated into one board 37. The power connectors 100, 102, 104 and 106, the transformer 107, the power switching components 95 and 97, signal switching component 46, and the input and output samplers 40 and 42 are all integrated into a separate board 39. The boards 37 and 39 are placed side-by-side lying substantially in a same plane. Communication between the boards 37 and 39 is accomplished through two ribbon cables (not shown). One ribbon cable is connected between ribbon cable connectors 111 and 113. Another ribbon cable is connected between ribbon cable connectors 115 and 117. In this embodiment, the power connector 106 receives normal power from the external power supply 91 and a connector 97 provides power to the power switching components 95 and 97 through a cable (not shown) that is connected to a cable connector 119. Other power lines are soldered on the board 39.

In operation, after program signals have been received at the headend 12, and modulated and amplified as needed, a combined signal is transmitted from the signal combiner 21 along the amplifier input signal path 22 to the RF input connector 88 of the amplifier switch controller 10. The input switch 47 of the amplifier switch controller 10 receives the combined signal from the RF input connector 88 and transmits the combined signal to either the first amplifier input 25 through the first amplifier input connector 90 if the first amplifier 24 is currently activated or to the second amplifier input 28 through the second amplifier input connector 92 if the second amplifier 26 is currently activated. A portion of the combined signal transmitted through the RF input connector 88 is drawn off by the directional coupler 124 and transmitted to the input sampler 40.

After the combined signal is amplified by the activated amplifier 24 or 26, the amplifier output 27 or 29 of whichever amplifier is currently activated, transmits the amplified combined signal to the corresponding amplifier output connector 94 or 96. The output switch 48 receives the amplified combined signal from either the first amplifier output connector 94 if the first amplifier 24 is currently activated or the second amplifier output connector 96 if the second amplifier 26 is currently activated. The amplified combined signal is then transmitted from the output switch 48 to the amplifier output signal path 23 through the RF output connector 98. A portion of the amplified combined signal transmitted through the output switch 48 is drawn off by the directional coupler 126 and transmitted to the output sampler 42.

In the input sampler 40, the combined signal is processed by the one-by-two splitter 128 which generates a first combined signal and a second combined signal. The amplitude of each of the first and second combined signals is adjusted by the attenuators 130-1 and 130-2, respectively. The filters 132-1 and 132-2 accommodate the high frequencies of the first and second combined signals, respectively. The filters 132-1 and 132-2 transmit first and second amplified combined signals to the amplifiers 134-1 and 134-2, respectively. The two amplified combined signals allow the microcontroller 110 to range switch if necessary with the differing inputs to the A/D converter 112. The quasi-peak detectors 136-1 and 136-2 detect the maximum amplitude of the first amplified combined signal and the second amplified combined signal, respectively. The detectors 136-1 and 136-2 transmit the detected amplitudes to the microcontroller 110 and the A/D converter 112 converts the analog signals into digital numbers. In the output sampler 42, the flow of the first and second combined signals parallels the flow of the first and second combined signals in the input sampler 40. After the input and output samplers 40 and 42 and the A/D converter 112 have completed processing the signals, the microcontroller 110 receives a digital signal of the combined signal that was input into the currently activated amplifier 24 or 26 and a digital output signal of the amplified combined signal that was output from the currently activated amplifier 24 or 26.

The microcontroller 110 has a software routine 150 (shown in FIG. 7) that processes the digital input and output signals and determines whether the currently activated amplifier 24 or 26 is functioning properly. The software routine 150 compares the actual gain of the currently activated amplifier to a desired range of amplifier gain for the particular amplifier. The actual gain is the gain (i.e., the ratio of output signal voltage to input signal voltage) of any combined program signal processed by the currently activated amplifier. The desired range of amplifier gain is, in one embodiment, the range of amplification calculated from an amplifier calibration gain (i.e., the gain of the currently activated amplifier measured during calibration) and a threshold gain (i.e., a default or user selected variable tolerance gain). The amplifier calibration gain and the threshold gain are combined to determine a desired lower gain range limit. In one embodiment, any gain value above the lower gain range limit is within the desired range of amplifier gain. However, it will be apparent that the desired range of amplifier gain could be any range of numbers and could be calculated in a variety of ways. For example, the desired range of amplifier gain could be between a lower gain range limit and an upper gain range limit, or could be a single gain value or number.

If the actual gain does not fall within the desired range of amplifier gain, then the currently activated amplifier is not functioning properly and the microcontroller 110 generates control signals to the signal switches 47 and 48 across the control signal paths 45 and 49, respectively. The control signals cause the input switch 47 to disconnect the signal flow path between the currently activated amplifier 24 or 26 and the amplifier input signal flow path 22, and to connect the other amplifier 26 or 24 to the amplifier input signal flow path 22. The control signals cause the output switch 48 to disconnect the signal flow path between the currently activated amplifier 24 or 26 and the amplifier output signal flow path 23, and to connect the other amplifier 26 or 24 to the amplifier output signal flow path 23. The comparison of the actual gain of the currently activated amplifier to the desired range of amplifier gain for the particular activated amplifier offers the advantage of flexibility because any amplifier capable of producing signals in the same desired range of amplifier gain can be used with the amplifier switch controller 10.

In one embodiment, the main power switches 99 and 101 and the backup power switches 103 and 105 will be transmitting power to only the currently activated amplifier 24 or 26 and the other amplifier will be cold. For example, as shown in FIG. 5, the first main power switch 99 is transmitting power to the first amplifier 24, which is the currently activated amplifier. The second main power switch 101 is not transmitting power to the second amplifier 26, which is inactive. Similarly, for backup purposes, the first backup power switch 103 is transmitting power to the first amplifier 24 and the second backup power switch 105 is not transmitting power to the second amplifier 26. This configuration saves energy and prevents the breakdown of the inactive amplifier due to running at high power levels. For example, in FIG. 5, the second amplifier 26 is not connected to input and output signal paths 22 and 23 and, therefore, is inactive. However, it will be apparent that in an alternative configuration both the first and second amplifiers 24 and 26 could be powered at all times.

If the currently activated amplifier is not functioning properly the microcontroller 110 generates power control signals to the first and second main power switches 99 and 101 and the first and second backup power switches 103 and 105 to tell the switches to start powering the inactive amplifier and to disconnect power from the currently activated amplifier. For example, if power control signals are transmitted by the microcontroller 110 in FIG. 5, indicating that the currently activated amplifier (i.e., in FIG. 5, the first amplifier 24) is not functioning properly, then the second main power switch 101 will connect the signal flow path between the normal power connector 106 and the second amplifier power connector 104. The first main power switch 99 will disconnect the signal flow path between the normal power connector 106 and the first amplifier power connector 102. Similarly, the second backup power switch 105 will connect the signal flow path between a power input of the terminal block 100 and a second amplifier backup power connector of the terminal block 100. The first backup power switch 103 will disconnect the signal flow path between the power input of the terminal block 100 and a first amplifier backup power connector of the terminal block 100. After the inactive amplifier has powered up, which is a predetermined delay period of approximately a 25 msec, the microcontroller 110 generates control signals to the signal switches 47 and 48 to connect the input and output signal paths 22 and 23 to the inactive amplifier, thereby making it the new currently activated amplifier.

Figure 7:
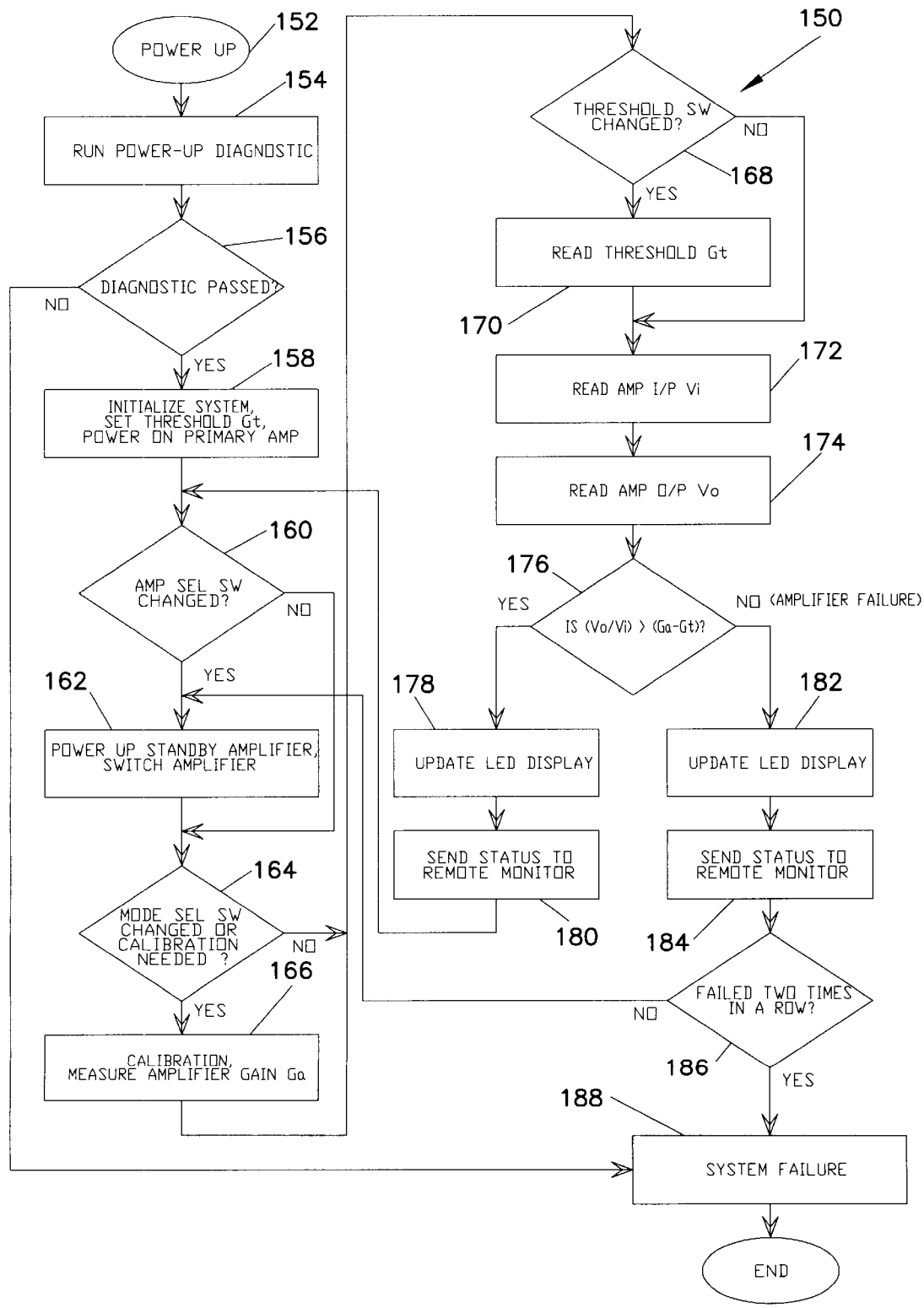
FIG. 7 is a flow chart of program software of a microcontroller, shown in FIG. 5, of the amplifier switch controller of FIG. 1.

FIG. 7 shows a block diagram of a software routine 150 processed by the microcontroller 110 to determine whether the currently activated amplifier, 24 or 26, is functioning properly and to generate appropriate control signals, if necessary, based upon the software routine calculations. Initially, the amplifier switch controller 110 is powered up in block 152 and a power-up diagnostic routine 154 is run. Software represented by control block 156 determines whether the diagnostic routine was passed. If it was not passed, then control is transferred to a system failure block 188 and the software routine 150 is terminated. Status signals indicating system failure are then transmitted to the monitoring device 33. If the diagnostic routine was passed, then control is transferred to block 158 to initialize the system, set the default threshold gain ($G_t$) (i.e., the default variable tolerance gain), and power on the first amplifier 24, which becomes the currently activated amplifier. Control is then passed to control block 160 to determine whether the amplifier selection switch 68 has been toggled to select a different amplifier. If the amplifier selection switch 68 has been toggled to a select an amplifier other than the currently activated amplifier, then software represented by block 162 sends control signals to the first and second main power switches 99 and 101 and the first and second backup power switches 103 and 105 to power up the selected amplifier, and eventually disconnect power to the currently activated amplifier. Control signals are also transmitted to input and output switches 47 and 48 to switch input and output signal flow paths 22 and 23 to the amplifier input and output of the selected amplifier, respectively, after the selected amplifier has had time to power up. Alternatively, if the amplifier selection switch 68 has not been toggled to select an amplifier other than the currently activated amplifier, then the commands represented by block 162 are bypassed.

Control is then passed to control block 164 to determine whether the mode selection switch 74 has been toggled to manually select the mode of the amplifier switch controller 10 or whether calibration of the amplifier switch controller 10 is otherwise needed. If the mode selection switch 74 has been toggled to calibration mode, or if calibration is otherwise needed, then control is passed to block 166 to set the amplifier switch controller 10 in a calibration mode. In the calibration mode the amplifier calibration gain ($G_a$) of the currently activated amplifier is measured. Calibration is needed even if the mode selection switch 74 has not been toggled when, for example, it is system startup and the amplifier calibration gain for the currently activated amplifier has not yet been measured. Calibration is also needed when a currently activated amplifier failed, was disconnected, and the other amplifier was powered up and connected to the input and output signal paths 22 and 23 to become the new currently activated amplifier. In this situation, a new $G_a$ is measured for the new currently activated amplifier. Alternatively, if the mode selection switch 74 has not been toggled to change the mode of the amplifier switch controller 10, and if calibration is not otherwise needed, then the commands represented by block 166 are bypassed.

Control is then passed to control block 168 to determine whether the user has toggled the threshold setting switch 84 to select a different threshold gain ($G_t$). If the user has toggled the threshold setting switch 84, then control passes to block 170 to read the new threshold gain ($G_t$). If the threshold setting switch 84 has not been toggled, then the commands represented in block 170 are bypassed and $G_t$ remains as the default value generated by software represented by block 158.

Control is then passed to block 172 where the digital input signal ($V_i$) generated by the input sampler 40 and the A/D converter 112, is read. In block 174, the digital output signal ($V_o$), generated by the output sampler 42 and the A/D converter 112, is read. In control block 176, the actual gain of the currently activated amplifier is calculated as $V_o/V_i$. The desired range of amplifier gain is also calculated by combining the actual gain ($G_a$) of the currently activated amplifier with the threshold gain ($G_t$) to determine the lower gain range limit ($G_a-G_t$) In the embodiment shown in FIG. 7, the desired range of amplifier gain then becomes any number higher than the lower gain range limit ($G_a-G_t$). If the actual gain ($V_o/V_i$) of the currently activated amplifier is greater than the lower gain range limit ($G_a-G_t$) then the currently activated amplifier is operating normally, and control signals are sent to update the LED displays as indicated in block 178. Control is then passed to block 180 to send status signals to the remote monitoring device 33. Control is then passed to control block 160 so that the amplifier selection switch 68, the mode selection switch 74 and the threshold setting switch 84 are checked to determine if they have been changed, before the software routine 150 monitors the currently activated amplifier 24 or 26 again. If the actual gain ($V_o/V_i$) of the currently activated amplifier is less than or equal to the lower gain range limit ($G_a-G_t$) as checked in block 176, then the currently activated amplifier 24 or 26 has failed. Software represented by block 182 sends control signals to update the LED displays on the front panel 54 of the amplifier switch controller 10. As indicated in block 184, status signals are sent to the remote monitoring device 33 to indicate the amplifier failure. Software represented by block 186 then checks whether amplifier failure has occurred twice in a row. If failure has occurred twice in a row, then control is passed to block 188 to indicate system failure and the software routine 150 is terminated. Alternatively, if the software routine 150 has not detected amplifier failure twice in a row, then control is passed from block 186 to block 162 to power up the amplifier not currently activated and to send control signals to disconnect input and output signal paths 22 and 23 from the currently activated amplifier and to connect input and output signal paths 22 and 23 to the other amplifier after the other amplifier has had time to power up.

It is to be understood that even though numerous characteristics and advantages of various embodiments of the present invention have been set forth in the foregoing description, together with details of the structure and function of various embodiments of the invention, this disclosure is illustrative only. Changes may be made in detail, especially in matters of structure and arrangement of parts within the principles of the present invention to the full extent indicated by the broad general meaning of the terms in which the appended claims are expressed.

The claimed invention is:

1. An amplifier switch controller for a headend processing system having at least a first amplifier and a second amplifier, one of the first and second amplifiers being currently activated, and the currently activated amplifier operatively connected to an input signal path and an output signal path, the input signal path carrying an input signal to the currently activated amplifier and the output signal path transmitting an amplified output signal from the currently activated amplifier, the controller comprising:

an input sampler operatively connected to the input signal path for sampling the signal on the input signal path and measuring an input signal level;

an output sampler operatively connected to the output signal path for sampling the amplified signal on the output signal path and measuring an amplified signal level;

program means for receiving the input signal level and the amplified signal level, for determining, using the received input and amplified signal levels, whether the currently activated amplifier is not functioning properly and for generating a control signal when the currently activated amplifier is not functioning properly; and a signal switching component controllably energized in response to said control signal for disconnecting the input and output signal paths from the currently activated amplifier and connecting each of the input and output signal paths to the other one of the first and second amplifiers, the signal switching component being coupled to the input signal path between the input sampler and the currently activated amplifier, and being coupled to the output signal path between the currently activated amplifier and the output sampler.

2. The amplifier switch controller according to claim 1 wherein said program means calculates a desired range of amplifier gain for the currently activated amplifier, calculates an actual amplifier gain of the currently activated amplifier from the input signal level and the output signal level, compares the actual amplifier gain to the desired range of amplifier gain, and generates said control signal when the actual amplifier gain falls outside the desired range of amplifier gain.

3. The amplifier switch controller according to claim 2 wherein an amplifier calibration gain and a gain threshold of the currently activated amplifier are used to calculate the desired range of amplifier gain.

4. The amplifier switch controller according to claim 3 wherein the gain threshold is manually selectable by a user.

5. The amplifier switch controller according to claim 3 wherein the gain threshold is generated by said program means.

6. The amplifier switch controller according to claim 3 wherein the amplifier calibration gain is generated by said program means.

7. The amplifier switch controller according to claim 1 wherein the signal switching component includes:

a signal input switch operatively connected to the amplifier input signal path; and a signal output switch operatively connected to the amplifier output signal path.

8. The amplifier switch controller according to claim 1 wherein the amplifier switch controller is operatively connected to a monitoring device.

9. The amplifier switch controller according to claim 8 wherein said program means transmits status information about said amplifier switch controller to said monitoring device, said monitoring device having a user display and receiving status information and displaying said status information in a user readable format on the user display.

10. The amplifier switch controller according to claim 8 wherein said monitoring device includes a user interface device, said monitoring device receiving user input through the user interface device and transmitting the user input to said amplifier switch controller.

11. The amplifier switch controller according to claim 1 further comprising:

means for receiving power from a power supply;

a power switching component operatively connected to the currently activated amplifier and transmitting the power thereto;

said program means generating a power control signal when the currently activated amplifier is not functioning properly; and said power switching component controllably energized in response to said power control signal for operatively connecting the power to the other one of the first and second amplifiers.

12. A headend system for processing cable television channel signals, said headend system comprising:

a. a plurality of receivers, each receiving a cable television channel signal;

b. a combiner operatively connected to said plurality of receivers for receiving each of the channel signals from each of said plurality of receivers, said combiner combining said channel signals into a combined signal having one frequency band;

c. an amplifier input signal path operatively connected to said combiner for transmitting said combined signal;

d. a first amplifier and a second amplifier, one of said first and second amplifiers being currently activated, said currently activated amplifier operatively connected to said amplifier input signal path for receiving said combined signal and generating an amplified combined signal;

e. an amplifier output signal path operatively connected to said currently activated amplifier for transmitting said amplified combined signal;

f. a controller connected to said input and output signal paths, said controller comprising:

i. an input sampler operatively connected to said input signal path for sampling said combined signal from said input signal path and for measuring an input signal level;

ii. an output sampler operatively connected to said output signal path for sampling the amplified combined signal from said output signal path and for measuring an output signal level;

iii. program means for using the input signal level and the output signal level to determine whether said currently activated amplifier is functioning properly and for providing a control signal when said currently activated amplifier is not functioning properly; and iv. a switch controllably energized in response to said control signal for switching said input and output signal paths from said currently activated amplifier to the other one of said first and second amplifiers, the switch being coupled to the input signal path between the input sampler and the currently activated amplifier, and being coupled to the output signal path between the currently activated amplifier and the output sampler; and g. a splitter operatively connected to said output signal path for receiving said amplified combined signal and generating a plurality of combined signals for distribution to a plurality of customers.

13. The amplifier switch controller according to claim 12 wherein said program means calculates a desired range of amplifier gain for said currently activated amplifier, calculates an actual amplifier gain of said currently activated amplifier from the input signal level and the output signal level, compares the actual amplifier gain to the desired range of amplifier gain, and generates said control signal when the actual amplifier gain falls outside the desired range of amplifier gain.

14. The amplifier switch controller according to claim 13 wherein an amplifier calibration gain and a gain threshold of said currently activated amplifier are used to calculate the desired range of amplifier gain.

15. The amplifier switch controller according to claim 14 wherein the gain threshold is manually selectable by a user.

16. The amplifier switch controller according to claim 14 wherein the gain threshold is generated by said program means.

17. The amplifier switch controller according to claim 14 wherein the amplifier calibration gain is measured by said program means.

18. The amplifier switch controller according to claim 12 further comprising:

means for receiving power from a power supply;

a power switching component operatively connected to said currently activated amplifier and transmitting the power thereto;

said program means generating a power control signal when said currently activated amplifier is not functioning properly; and said power switching component controllably energized in response to said power control signal for operatively connecting the power to the other one of said first and second amplifiers.

19. An amplifier switch controller for a headend processing system having at least a first amplifier and a second amplifier, one of the first and second amplifiers being currently activated, the currently activated amplifier operatively connected to an input signal path and an output signal path, the input signal path carrying an input signal to the currently activated amplifier and the output signal path transmitting an amplified output signal from the currently activated amplifier, the controller comprising:

an input sampler for sampling the input signal carried on the input signal path and measuring an input signal level of the input signal;

an output sampler for sampling the amplified output signal on the output signal path and measuring an output signal level of the amplified output signal;

program means for receiving the input and output signal levels, for calculating an actual gain of the currently activated amplifier from the input signal level and the output signal level, comparing the actual gain to a desired range of amplifier gain of the currently activated amplifier, generating a control signal when the actual gain does not fall within the desired range of amplifier gain of the currently activated amplifier; and a switch controllably energized in response to said control signal for disconnecting the input and output signal paths from the currently activated amplifier and for connecting each of the input and output signal paths to the other one of the first and second amplifiers.

20. The amplifier switch controller according to claim 19 wherein said program means calculates the desired range of amplifier gain for the currently activated amplifier.

21. The amplifier switch controller according to claim 20 wherein a gain threshold is used to calculate the desired range of amplifier gain.

22. The amplifier switch controller according to claim 21 wherein the gain threshold is manually selectable by a user.

23. The amplifier switch controller according to claim 21 wherein said controller is operatively configured on a circuit board, the circuit board being housed inside a frame defining an enclosed interior and having a front panel and a rear panel; and said front panel provides a manual switch and display area for setting said gain threshold.

24. An amplifier switch control system for a headend processing system having at least a first amplifier and a second amplifier, one of the first and second amplifiers being in use, and the currently activated amplifier operatively connected to an input signal path and an output signal path, the input signal path carrying an input signal to the currently activated amplifier and the output signal path transmitting an amplified output signal from the currently activated amplifier, the controller comprising:

an input sampler circuit operatively connectable to the input signal path to measure an input signal level on the input signal path;

an output sampler circuit operatively connectable to the output signal path to measure an amplified signal level on the output signal path;

a controller coupled to receive the input and amplified signal levels and to generate a control signal indicative of an operating condition of the amplifier in use in response to the received input and amplified signal levels; and a switch element connected to the controller and couplable to the first and second amplifiers to disconnect the input and output signal paths from the amplifier in use and to connect the input and output signal paths to the other one of the first and second amplifiers in response to the control signal, the switch element being coupled to the input signal path between the input sampler and the currently activated amplifier, and being coupled to the output signal path between the currently activated amplifier and the output sampler.

25. A system as recited in claim 24, wherein the controller measures actual gain of the amplifier in use from the input and amplified signal levels, and directs the control signal to the switch element to disconnect the input and output signal paths form the amplifier in use when the actual gain of the amplifier in use falls outside a predetermined gain range.

26. A system as recited in claim 25, wherein the controller calculates the predetermined gain range from an amplifier calibration gain and a gain threshold of the amplifier in use.

27. A system as recited in claim 24, wherein the switch element includes a signal input switch connected to the input signal path and switchable between the first and second amplifiers, and a signal output switch connected to the output signal path and switchable between the first and second amplifiers.

28. A system as recited in claim 24, further comprising a monitoring device, connected to the controller, to display switch control system status information received from the controller.

29. An amplifier switch controller for a headend processing system having at least a first amplifier and a second amplifier, one of the first and second amplifiers being currently activated, and the currently activated amplifier operatively connected to an input signal path and an output signal path, the input signal path carrying an input signal to the currently activated amplifier and the output signal path transmitting an amplified output signal from the currently activated amplifier, the controller comprising:

an input sampler operatively connected to the input signal path for sampling the signal on the input signal path and measuring an input signal level;

an output sampler operatively connected to the output signal path for sampling the amplified signal on the output signal path and measuring an amplified signal level;

program means for receiving the input signal level and the amplified signal level, for determining actual amplifier gain from the received input and output signal levels, comparing the actual amplifier gain to a desired range of amplifier gain and for generating a control signal when the actual gain of the currently activated amplifier falls outside the desired range of amplifier gain; and a signal switching component controllably energized in response to said control signal for disconnecting the input and output signal paths from the currently activated amplifier and connecting each of the input and output signal paths to the other one of the first and second amplifiers.

30. The amplifier switch controller according to claim 29, wherein said program means calculates the desired range of amplifier gain for the currently activated amplifier.

31. The amplifier switch controller according to claim 30 wherein an amplifier calibration gain and a gain threshold of the currently activated amplifier are used to calculate the desired range of amplifier gain.

32. The amplifier switch controller according to claim 29 wherein the signal switching component includes:

a signal input switch operatively connected to the amplifier input signal path; and a signal output switch operatively connected to the amplifier output signal path.

33. The amplifier switch controller according to claim 29 wherein the amplifier switch controller is operatively connected to a monitoring device and said program means transmits status information about said amplifier switch controller to said monitoring device, said monitoring device having a user display and receiving status information and displaying said status information in a user readable format on the user display.

34. The amplifier switch controller according to claim 33 wherein said monitoring device includes a user interface device, said monitoring device receiving user input through the user interface device and transmitting the user input to said amplifier switch controller.

35. The amplifier switch controller according to claim 29 further comprising:

means for receiving power from a power supply;

a power switching component operatively connected to the currently activated amplifier and transmitting the power thereto;

said program means generating a power control signal when the currently activated amplifier is not functioning properly; and said power switching component controllably energized in response to said power control signal for operatively connecting the power to the other one of the first and second amplifiers.

36. A headend system for processing cable television channel signals, said headend system comprising:

a. a plurality of receivers, each receiving a cable television channel signal;

b. a combiner operatively connected to said plurality of receivers for receiving each of the channel signals from each of said plurality of receivers, said combiner combining said channel signals into a combined signal having one frequency band;

c. an amplifier input signal path operatively connected to said combiner for transmitting said combined signal;

d. a first amplifier and a second amplifier, one of said first and second amplifiers being currently activated, said currently activated amplifier operatively connected to said amplifier input signal path for receiving said combined signal and generating an amplified combined signal;

e. an amplifier output signal path operatively connected to said currently activated amplifier for transmitting said amplified combined signal;

f. a controller connected to said input and output signal paths, said controller comprising:

i. an input sampler operatively connected to said input signal path for sampling said combined signal from said input signal path and for measuring an input signal level;

ii. an output sampler operatively connected to said output signal path for sampling the amplified combined signal from said output signal path and for measuring an output signal level;

iii. program means for determining a level of gain of said currently operating amplifier from the input signal level and the output signal level, determining whether the determined level of gain lies within a predetermined acceptable gain range, and for providing a control signal when the determined level of gain is outside the predetermined acceptable gain range; and iv. a switch controllably energized in response to said control signal for switching said input and output signal paths from said currently activated amplifier to the other one of said first and second amplifiers; and g. a splitter operatively connected to said output signal path for receiving said amplified combined signal and generating a plurality of combined signals for distribution to a plurality of customers.

37. The amplifier switch controller according to claim 36 wherein said program means calculates the predetermined acceptable gain range for said currently activated amplifier.

38. The amplifier switch controller according to claim 37 wherein an amplifier calibration gain and a gain threshold of said currently activated amplifier are used to calculate the predetermined acceptable gain range.

39. The amplifier switch controller according to claim 38 wherein the amplifier calibration gain is measured by said program means.

40. The amplifier switch controller according to claim 36 further comprising:

means for receiving power from a power supply;

a power switching component operatively connected to said currently activated amplifier and transmitting the power thereto;

said program means generating a power control signal when said currently activated amplifier is not functioning properly; and said power switching component controllably energized in response to said power control signal for operatively connecting the power to the other one of said first and second amplifiers.

41. An amplifier switch control system for a headend processing system having at least a first amplifier and a second amplifier, one of the first and second amplifiers being in use, and the currently activated amplifier operatively connected to an input signal path and an output signal path, the input signal path carrying an input signal to the currently activated amplifier and the output signal path transmitting an amplified output signal from the currently activated amplifier, the controller comprising:

an input sampler circuit operatively connectable to the input signal path to measure an input signal level on the input signal path;

an output sampler circuit operatively connectable to the output signal path to measure an amplified signal level on the output signal path;

a controller coupled to receive the input and amplified signal levels and to generate a control signal indicative of whether an actual amplifier gain level, calculated from the input and amplified signal levels, lies within a predetermined gain range; and a switch element connected to the controller and couplable to the first and second amplifiers to disconnect the input and output signal paths from the amplifier in use and to connect the input and output signal paths to the other one of the first and second amplifiers in response to the control signal.

42. A system as recited in claim 41, wherein the controller calculates the predetermined gain range from an amplifier calibration gain and a gain threshold of the amplifier in use.

43. A system as recited in claim 41, wherein the switch element includes a signal input switch connected to the input signal path, the signal input switch being switchable between the first and second amplifiers, and a signal output switch connected to the output signal path, the signal output switch being switchable between the first and second amplifiers.

44. A system as recited in claim 41, further comprising a monitoring device, connected to the controller, to display switch control system status information received from the controller.

* * * * *